May 27, 1958 J. O. WELDON 2,836,665

AMPLIFIERS

Filed Aug. 29, 1957

INVENTOR
JAMES O. WELDON
BY
Moses, Nolte & Nolte
ATTORNEYS

United States Patent Office 2,836,665

Patented May 27, 1958

2,836,665

AMPLIFIERS

James O. Weldon, Dallas, Tex.

Application August 29, 1957, Serial No. 681,081

19 Claims. (Cl. 179—171)

This invention relates to a high efficiency power amplifier for modulating carrier waves. More particularly the invention relates to amplifiers of the type commonly known as Doherty amplifiers. This application is a continuation-in-part of my copending application Serial No. 443,331, filed July 14, 1954, now abandoned.

The Doherty amplifier comprises essentially two electron tubes connected to a source of modulated waves so that the waves are impressed on the tubes in phase quadrature. The outputs of the tubes are connected to a common load so that one of the outputs is shifted in phase by 90 degrees. The carrier tube is biased substantially to cutoff, and the other or peak amplifier tube is biased beyond cutoff so that it amplifies only those portions of the modulated carrier wave which are above the average level thereof. The load circuit impedance is half the impedance that would be used with the carrier amplifier if this tube were functioning as a conventional class-B amplifier developing its full output. The characteristic impedance of the phase shifting network in the output circuit is made equal to twice the load impedance. When the amplitude of the exciting voltage is below the carrier level only the carrier tube is operative and works into an effective load impedance equal to twice the impedance that would be used to develop full output therefrom. When the signal level is greater than the average carrier level the peak tube begins to operate and feeds additional power to the load. This increases the apparent load impedance and, since the phase shifting network connected to the load acts as a quarter wavelength line, the apparent increase in impedance of the load is converted into an apparent decrease in impedance at the output of the carrier tube. Under these conditions, when the carrier wave is modulated 100%, the peak amplifier supplies half of the output power, the apparent load impedance of the carrier tube is equal to half of the actual load impedance, and the carrier tube then supplies the remaining half of the required peak power. Thus, the two tubes supply four times as much power at 100% modulation peaks as is supplied by the carrier tube alone at the carrier level.

Amplifiers operating as described above, have the outstanding advantage of high operating efficiency. However, such amplifiers are characterized by a considerable degree of non-linearity of amplification, which, of course, results in modulation distortion. In addition these amplifiers require neutralization of each tube and are subject to instability.

It is an object of this invention generally to improve high efficiency amplifiers of the type described above.

It is another object of the invention to improve the linearity characteristics of a Doherty amplifier.

It is a further object to increase the suppression of harmonics in Doherty amplifiers.

Considering the very high power ratings of amplifiers of the present type, another object and important advantage of this invention is the simplification of the circuit connections.

Still another object of the invention is to provide a Doherty amplifier which requires no neutralization in one stage thereof.

A further object of the invention is to improve the operation of the amplifier particularly at high frequencies by reducing the plate to ground capacitive loading of one of the amplifier stages.

The above, and other objects which will become apparent, are attained in one specific embodiment of the invention by connecting the control grid of the peak amplifier tube directly to a source of modulated waves and connecting the cathode of the carrier amplifier to the source through a 90 degree phase shifting network. A load circuit is connected directly to the anode of the peak amplifier and through a 90 degree phase shifting network to the anode of the carrier amplifier. The two phase shifting networks may be alike and produce phase shift of the same sign. The grid of the carrier tube is grounded for carrier wave potentials so that the carrier tube operates as a grounded grid amplifier. The output circuit impedances and the biases are adjusted as described above so that the carrier tube alone operates until the modulated wave reaches the carrier level, and thereafter the peak amplifier also becomes operative.

According to the invention, where the carrier tube is operated in the grounded grid connection, the load seen by the R. F. driver at the cathode of the carrier tube, which is reflected through from the antenna, is a resistance equal to the R. M. S. drive voltage divided by the R. F. output plate current of the power amplifier. Since in the carrier tube this R. F. output plate current doubles, and since the drive voltage also doubles at the positive peak of modulation, the power delivered to the antenna by the driver stage through the carrier tube is four times that which is delivered by this driver stage at the carrier level. However, since the carrier tube is required only to deliver two times carrier power, the net result is that the antenna receives slightly more power than is required for the 100% amplitude modulated case. This effect is very desirable, because when the transmitter is modulated, line voltage regulation causes some negative carrier shift, that is, a carrier amplitude reduction, because of the extra demand placed on the power supply source. This extra power, delivered by the driver through the carrier tube, compensates for the normal negative carrier shift which might otherwise occur. The actual result is that the carrier shift instead of being negative, as is common, is either zero or positive. Of course, if it is positive, it can be maintained at zero, merely by further degrading the regulation of the system. But some additional regulation is automatically provided, because the load is reflected through the carrier tube to the driver stage thereby regulating the latter.

According to another embodiment of the invention, the peak amplifier tube is connected substantially as described above, but the carrier amplifier tube is connected essentially as a cathode follower. The grid of the carrier tube is connected to the radio frequency input source, through a 90° phase shift network which has a voltage step-up ratio. The anode of the carrier tube is by-passed to ground while the cathode is connected to the anode of the peak tube and to the output load through a 90° phase shifting network. It is necessary to provide a voltage step-up in the phase shifting network connected to the grid of the carrier tube because the output voltage of this tube is less than the input voltage. However, a carrier amplifier of this type has a very high input impedance and, therefore, it is easy to obtain the step-up voltage in the input network connected to the grid of the carrier tube. When the peak tube causes the impedance at the output of the carrier tube to change, the cathode follower tube will attempt to deliver to this changing load, a replica of the voltage applied at its grid. This effect, although reduced somewhat by carrier tube grid current, has the advantage of causing a reduction of negative carrier shift or actually producing a positive carrier shift. The effect of carrier tube grid current loading will be to decrease the output impedance of the input phase shifting network and cause an increase in impedance at the input of the input network, and thereby increasing the ability of the R. F. source to drive the peak tube into high modulation peaks.

Other objects and advantages of the invention will become apparent and the invention will be fully understood from the following description and the drawing in which.

Figure 1:
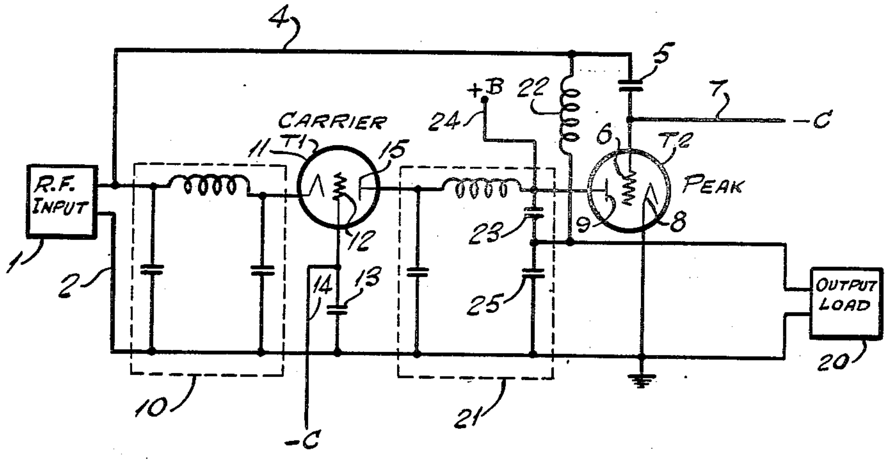
Fig. 1 is a circuit diagram of one embodiment of the invention.

Referring to Fig. 1, there is shown a radio frequency circuit 1 which may be a driver amplifier supplying modulated carrier waves. The carrier wave supply circuit 1 has a grounded connection 2 and a high potential connection 3. The high potential terminal 3 has a connection 4 through a by-pass condenser 5 to the control grid 6 of the peak amplifier tube T2. The high potential terminal 3 is also connected through a phase shifting network 10 to the cathode 11 of the carrier amplifier tube T1. The phase shifting network 10 is shown as a $\pi$ network, but it will be understood that it can be any equivalent circuit, or a quarter wave-length artificial transmission line, adapted to produce a 90° phase shift. The purpose of the network 10 is to impress the carrier wave potentials on the control grid 6 and cathode 11 in phase quadrature. The control grid 12 of tube T1 is effectively grounded through condenser 13 and it is supplied with C bias by a connection 14. Likewise the control grid 6 of tube T2 is supplied with C bias through a connection 7. Voltage is applied to anodes 9 and 15 by a connection 24 which may extend to the B+ source through the customary R. F. choke coil and filter circuits (not shown). The cathode 8 of tube T2 is grounded. The plate 9 of tube T2 is connected substantially directly to a load 20, having a capacitor 25 in parallel therewith. As is evident, capacitor 25 is effectively part of the load circuit and may serve to resonate the load circuit. The plate 15 of tube T1 is connected to the load 20 through a phase shifting network 21 adapted to introduce a 90° phase shift. The phase shifting networks 10 and 21 may have, as shown, substantially identical configurations and in the present embodiment both provide a phase lag. The use of phase lag networks 10 and 21 permits the obtention of a higher degree of harmonic suppression than could be obtained if the networks had phase shifts of opposite sign.

Neutralization for the tube T2 is provided by connecting the control grid 6 through condenser 5, inductance 22 and a blocking condenser 23 to the anode 9. The tube T1, however, requires no neutralization, in view of the fact the control grid is grounded.

The operation of the circuit of Fig. 1 is as follows: The modulated carrier wave from the R. F. input circuit 1 is supplied to the control grid 6 of the tube T2 and the cathode 11 of tube T1 90° out of phase by virtue of the phase shifting network 10. Grid 6 of tube T2 is biased beyond cutoff so that it does not begin to conduct until the modulated carrier wave exceeds the carrier level. On the other hand, the grid 12 of tube T1 is biased to the projected cutoff point so that it amplifies carrier waves of all amplitudes. The anode 15 of tube T1 supplies the load 20 through the phase shifting network 21, the characteristic impedance of which is twice the load impedance. When the carrier level is exceeded, tube T2 supplies power to the load, increasing the voltage across the load relative to the current supplied by the tube T1, to cause an apparent increase of load impedance. The quarter wave length line or phase shifting network 21 converts the apparent increase in impedance to an apparent decrease of impedance across the output terminals of tube T1. This tube is, therefore, able to supply a greater current to the load even though the tube is operating at voltage saturation. At the peak carrier amplitudes occurring during 100% modulation, tube T2 supplies half of the total R. F. power to the load 20 and increases the apparent impedance of the load to a value equal to the characteristic impedance of network 21. The apparent load impedance of tube T1 is then one half of what is was before tube T2 became operative. Hence tube T1 supplies twice as much power and tubes T1 and T2 together supply four times as much power as is supplied at the carrier level. Thus the required power at 100% modulation is provided.

Power amplifiers of the type described above may have peak power outputs of several hundred kilowatts. Hence, at peak power, regulation of the power supply occurs and causes a reduction of carrier wave output power. This reduction is compensated in the present circuit. The carrier current output of tube T1 increases at the modulation peaks and the driving voltage from source 1 also increases so that the power supplied by the R. F. source 1 to the load increases with carrier wave voltage at more than a linear rate. The excess power supplied by source 1 therefore compensates for the reduction in R. F. power which normally occurs, and thus enables the amplifier to have a linear amplification characteristic. Thus an important defect of the Doherty amplifier is overcome.

Figure 2:
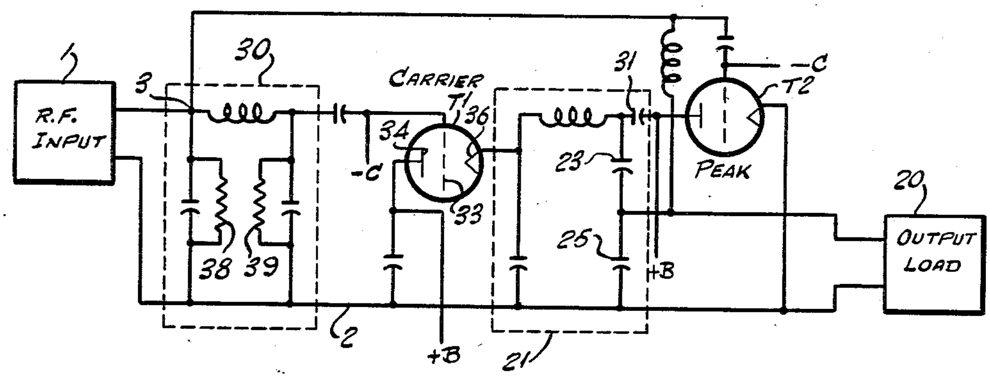
Fig. 2 is a circuit diagram of another embodiment of the invention.

In the embodiment illustrated in Fig. 2, the peak amplifier tube T2 is connected similarly to the peak amplifier tube of Fig. 1, except that the anode is connected to phase shifting network 21 through blocking condenser 31. The control grid 33 of carrier tube T1 is connected to the R. F. input source 1, through a 90° phase delay network 30. Since tube T1 is connected as a cathode follower, the output voltage is less than its input voltage and therefore, a high input voltage is required. In order to supply this high input voltage, the phasing network 30 is designed to provide a voltage step-up. The manner in which a network of this type is designed to give a voltage step-up is well known in the art. The obtainment of the voltage step-up is facilitated by the fact that tube T1 has a high input impedance. Also, since the carrier tube drive voltage is not required to have 100% modulation peaks, the regulation of the voltage step-up network is unimportant. The anode 34 of tube T1 is connected to a suitable source of voltage +B and is grounded through a by-pass condenser 35. The cathode 36 is connected to phase shifting network 21 and is isolated from +B and the anode of tube T2 by blocking condenser 31. The output load 20 is connected across the condenser 25 and is isolated by blocking condenser 23, as previously described in reference to Fig. 1.

The operation of the circuit shown in Fig. 2 is similar to that of Fig. 1. Control grid 33 receives a high input voltage by virtue of the voltage step-up ratio of input circuit 30. Tube T1 tends to maintain a constant output voltage across the load impedance presented to cathode 36. Tube T1, therefore, operates ideally as a carrier tube amplifier of a high efficiency amplifier, since with a constant voltage output, the impedance change on peaks of modulation result in doubling of the current output from the carrier tube, which is exactly what is required of the carrier tube of a Doherty amplifier. The effect of carrier tube grid current loading will be the same as in the previously described circuit, lowering the impedance at the output of circuit 30 and causing an increase in impedance at the input of network 30 and thereby giving the same improvement in the ability to drive the peak tube T2 into high modulation peaks. In some instances, it is desirable to provide resistors 38 and 39 for network 30 to regulate the effect of load changes on network 30.

For the sake of clarity and simplicity the invention has been illustrated by simplified diagrams from which power supplies and other conventional elements and connections are omitted. It must be noted, therefore, that within the spirit and scope of the claims many modifications and variations will be apparent to those skilled in this art.

I claim:

1. An amplifying system comprising a source of modulated carrier waves, a pair of electron tube amplifiers including a cathode, control grid and anode in each tube, a load circuit, means connecting the load circuit between the anode and cathode of both tubes and for producing a 90 degree phase shift of the output of one tube relative to the output of the other tube, input circuit means for impressing the modulated waves between the control grid and cathode of said tubes in phase quadrature, means for biasing one tube substantially to cutoff and the other tube so that it begins to conduct when the modulated wave reaches substantially the unmodulated carrier level, connecting means including said input circuit means for maintaining the cathode of said one tube at a higher carrier wave potential than the grid of said one tube.

2. An amplifying system according to claim 1, wherein said connecting means includes means for maintaining the grid of said one tube substantially at ground potential with respect to the carrier wave.

3. An amplifying system according to claim 2, wherein said one tube is connected to said source of modulated waves and to said load through phase shifting networks having phase shifts of the same sign.

4. An amplifying system according to claim 3, wherein said phase shifting networks have substantially equal phase shifts.

5. An amplifying system according to claim 1, including means for feeding more than twice the amount of carrier wave power from said source of modulated carrier waves through said one tube to said load when the carrier wave is 100% modulated than when the carrier wave is unmodulated.

6. An amplifying system according to claim 2, including means for neutralizing only said other tube.

7. An amplifying system according to claim 1, comprising means including said input circuit means for reflecting said load across said source of carrier waves at a sufficiently low impedance relative to the impedance of said source to cause appreciable regulation of said source.

8. A high efficiency modulated carrier wave amplifier comprising a source of modulated carrier waves, a load circuit, a first transmission path and a second transmission path connected between said source and said load, each transmission path having an electron tube amplifier, means for impressing modulated carrier waves on the inputs of said amplifiers in phase quadrature, means for causing the outputs of said amplifiers to be impressed on said load substantially in the same phase and circuit connections in said transmission paths for causing said electron tubes to produce phase shifts therewithin differing by 180 degrees.

9. A modulated carrier wave amplifier according to claim 8, wherein said transmission paths include means for causing one of said electron tubes to produce a phase reversal between its input and output and the other electron tube to amplify said waves without a phase reversal.

10. A modulated carrier wave amplifier according to claim 8, wherein said source has a high potential terminal connected to the cathode of one of said electron tubes and a low potential terminal connected to the control grid of said one tube, whereby carrier wave potentials are impressed on said cathode.

11. A modulated carrier wave amplifier according to claim 8, wherein the electron tube amplifier in one of said transmission paths is a grounded grid amplifier.

12. A modulated carrier wave amplifier according to claim 8, wherein one of the transmission paths includes a 90° phase delay network connected between the source and the input of one electron tube amplifier and a second 90° phase delay network connected between the load and the output of said one electron tube amplifier.

13. A modulated carrier wave amplifier according to claim 8, including means for feeding an appreciable amount of carrier wave power from said source to said load to compensate for non-linearity of amplification at the modulation peaks.

14. A modulated carrier wave amplifier comprising a source of modulated carrier waves, an electron tube carrier amplifier and an electron tube peak amplifier having input and output circuits, a load connected to both output circuits, both input circuits being connected to said source, the input and output circuits connected to the carrier tube including circuits for producing a quadrature phase shift of the same sign, means for biasing the carrier tube substantially to cutoff and biasing the peak tube beyond cutoff so that it does not conduct until the carrier wave rises above its unmodulated level, the carrier amplifier being a grounded-grid amplifier and the peak amplifier being a grounded cathode amplifier.

15. Apparatus for amplifying amplitude modulated carrier waves with a high efficiency in an electron tube carrier amplifier biased substantially to cut-off and an electron tube peak amplifier biased beyond cut-off so that it does not conduct until the carrier wave rises above its unmodulated level, the modulated carrier waves being fed to said amplifiers in a quadrature phase relationship and the outputs of said amplifiers being impressed on a load after being shifted in phase 90° relative to each other and the peak amplifier is of the grounded cathode type; the improvement which consists in connecting means for grounding the control grid of the electron tube carrier amplifier and maintaining its cathode at a high carrier wave potential.

16. An amplitude modulated carrier wave amplifier comprising a source of modulated carrier waves, an electron tube carrier amplifier and an electron tube peak amplifier having input and output circuits, a load connected to both output circuits, both input circuits being connected to said source, the input and output circuits connected to the carrier tube including networks for producing a quadrature phase shift of the same sign, means for biasing the carrier tube substantially to cut-off and biasing the peak tube beyond cut-off so that it does not conduct until the carrier wave rises above its unmodulated level, the carrier amplifier having its cathode connected to ground through a substantial impedance so that the cathode is at a substantial carrier wave potential and the peak amplifier being a grounded cathode amplifier.

17. A modulated carrier wave amplifier comprising a source of amplitude modulated carrier waves, an electron tube carrier amplifier and an electron tube peak amplifier having input and output circuits, a load connected to both output circuits, both input circuits being connected to said source, the input and output circuits connected to the carrier tube including networks for producing a quadrature phase shift of the same sign, means for biasing the carrier tube substantially to cut-off and biasing the peak tube beyond cut-off so that it does not conduct until the carrier wave rises above its unmodulated level, the carrier amplifier having its anode grounded and its cathode connected to the carrier amplifier output circuit, the carrier amplifier input circuit connecting said source to the carrier amplifier control grid and having a voltage step-up characteristic for impressing a carrier wave voltage on said control grid which is greater than the input voltage supplied to the peak amplifier.

18. An amplifier according to claim 17, wherein the carrier amplifier input circuit includes shunting resistors connected across the input and output thereof.

19. A modulated carrier wave amplifier comprising a source of amplitude modulated carrier waves, an electron tube carrier amplifier and an electron tube peak amplifier having input and output circuits, a load connected to both output circuits, both input circuits being connected to said source, the input and output circuits connected to the carrier tube including networks for producing a quadrature phase shift of the same sign, means for biasing the carrier tube substantially to cut-off and biasing the peak tube beyond cut-off so that its does not conduct until the carrier wave rises above its unmodulated level, the carrier amplifier having its anode grounded and its cathode connected to the carrier amplifier output circuit and its control grid connected to a carrier wave high potential point of the carrier amplifier input circuit.

References Cited in the file of this patent

UNITED STATES PATENTS

| | | |
|---|---|---|
| 2,210,028 | Doherty | Aug. 6, 1940 |
| 2,476,875 | Ketchledge | July 19, 1949 |
| 2,658,959 | Doherty | Nov. 10, 1953 |